(12) United States Patent
Fujioka et al.

(10) Patent No.: US 7,608,796 B2
(45) Date of Patent: Oct. 27, 2009

(54) PLASMA GENERATING ELECTRODE AND PLASMA REACTOR

(75) Inventors: Yasumasa Fujioka, Nagoya (JP); Atsuo Kondou, Okazaki (JP); Takeshi Sakuma, Nagoya (JP); Masaaki Masuda, Nagoya (JP); Kenji Dosaka, Shioya-gun (JP); Kazuhiro Kondo, Utsunomiya (JP)

(73) Assignees: NGK Insulators, Ltd., Nagoya (JP); Honda Motor Co., Ltd., Tokyo (JP)

( * ) Notice: Subject to any disclaimer, the term of this patent is extended or adjusted under 35 U.S.C. 154(b) by 611 days.

(21) Appl. No.: 11/389,010

(22) Filed: Mar. 27, 2006

(65) Prior Publication Data

US 2006/0222577 A1    Oct. 5, 2006

(30) Foreign Application Priority Data

Mar. 30, 2005   (JP)   ............................. 2005-098272

(51) Int. Cl.
*B23K 10/00*   (2006.01)
(52) U.S. Cl. ............................. 219/121.36; 219/121.43; 219/121.52; 219/121.54
(58) Field of Classification Search ............ 219/121.36, 219/121.43, 121.54
See application file for complete search history.

(56) References Cited

U.S. PATENT DOCUMENTS

2002/0005395 A1   1/2002   Yanobe et al.

FOREIGN PATENT DOCUMENTS

| EP | 0 997 926 A2 | 5/2000 |
| EP | 1 643 093 A1 | 4/2006 |
| EP | 1 675 156 A1 | 6/2006 |
| JP | A-2001-164925 | 6/2001 |
| WO | WO 2005/001250 A1 | 1/2005 |

*Primary Examiner*—Mark H Paschall
(74) *Attorney, Agent, or Firm*—Oliff & Berridge, PLC

(57) ABSTRACT

A plasma generating electrode capable of generating plasma with a high energy level by using a small amount of electric power is provided. The plasma generating electrode includes at least a pair of unit electrodes including a unit electrode as an anode and a unit electrode as a cathode, and can generate plasma by applying voltage, the unit electrode as an anode and the unit electrode as a cathode being disposed facing each other, and at least the unit electrode as an anode having a plate-like ceramic dielectric and a conductive film disposed in the ceramic dielectric, wherein the unit electrode as a cathode can emit secondary electrons in a number five times or greater than the number of cations (primary particles) which it receives when the cations produced in the process of plasma generation collide therewith.

6 Claims, 3 Drawing Sheets

US 7,608,796 B2

PLASMA GENERATING ELECTRODE AND PLASMA REACTOR

BACKGROUND OF THE INVENTION

1. Field of the Invention

The present invention relates to a plasma generating electrode and a plasma reactor. More particularly, the invention relates to a plasma generating electrode and a plasma reactor capable of generating plasma with a high energy level by using a small amount of electric power.

2. Description of Related Art

A silent discharge is generated by disposing a dielectric between two electrodes of which the two ends are secured, and applying a high alternating current voltage or a periodic pulsed voltage between the electrodes. In the resulting plasma field, active species, radicals, and ions are produced to promote a gaseous reaction and decomposition. This phenomenon may be utilized to remove toxic components contained in engine exhaust gas or incinerator exhaust gas.

A plasma reactor or the like has been disclosed which treats toxic components such as $NO_x$, carbon particulates, HC, CO, and the like contained in exhaust gas discharged from an engine, an incinerator, or the like by causing the exhaust gas to pass through a plasma field using such plasma generating electrodes for generating plasma (for example, Patent Document 1).

(Patent Document 1) Japanese Patent Application Laid-open No. 2001-164925

SUMMARY OF THE INVENTION

However, when nitrogen monoxide (NO) contained in exhaust gas discharged from an engine or the like is treated using such a plasma reactor, an extremely large amount of electric power must be supplied in order to generate plasma having an energy level required for treating NO. Known plasma reactors have a problem of low energy efficiency.

The present invention has been achieved in view of this problem, and provides a plasma generating electrode and a plasma reactor capable of generating plasma with a high energy level using a small amount of electric power.

Specifically, the present invention provides the following plasma generating electrode and plasma reactor.

[1] A plasma generating electrode comprising at least a pair of unit electrodes including a unit electrode as an anode and a unit electrode as a cathode, and capable of generating plasma by applying voltage, the unit electrode as an anode and the unit electrode as a cathode being disposed facing each other, and at least the unit electrode as an anode having a plate-like ceramic dielectric and a conductive film disposed in the ceramic dielectric, wherein the unit electrode as a cathode can emit secondary electrons in a number five times or greater than the number of cations (primary particles) which it receives when the cations produced in the process of plasma generation collide therewith (hereinafter referred to from time to time as "first invention").

[2] The plasma generating electrode according to [1], wherein the unit electrode as a cathode contains at least one material selected from the group consisting of beryllium-copper alloy, silver-magnesium alloy, aluminum-magnesium alloy, nickel-beryllium alloy, cesium oxide, binary oxide of barium and strontium, zinc sulfide, and calcium tungstate.

[3] The plasma generating electrode according to [1] or [2], wherein the ceramic dielectric of the unit electrode as an anode contains at least one ceramic selected from the group consisting of alumina, mullite, ceramic glass, zirconia, cordierite, silicon nitride, aluminum nitride, and glass.

[4] The plasma generating electrode according to any of [1] to [3], wherein the conductive film of the unit electrode as an anode contains at least one metal selected from the group consisting of tungsten, molybdenum, manganese, chromium, titanium, zirconium, nickel, iron, silver, copper, platinum, and palladium.

[5] A plasma reactor comprising the plasma generating electrode according to any of [1] to [4], and a casing having a passage (gas passage) for a gas containing a specific component formed therein, wherein, when the gas is introduced into the gas passage of the casing, the specific component contained in the gas can be reacted by plasma generated by the plasma generating electrode (hereinafter referred to from time to time as "second invention").

[6] The plasma reactor according to [5], further comprising one or more pulse power supplies for applying voltage to the plasma generating electrode.

[7] The plasma reactor according to [6], wherein the pulsed power supply includes at least one SI thyristor.

BRIEF DESCRIPTION OF THE DRAWINGS

FIG. 5($b$) is a cross-sectional view along the line B-B shown in FIG. 5($a$).

DETAILED DESCRIPTION OF THE INVENTION AND PREFERRED EMBODIMENT

Because the plasma generating electrode and plasma reactor of the present invention has a unit electrode as an anode having a plate-like ceramic dielectric and a conductive film disposed in the ceramic dielectric, and the unit electrode as a cathode can emit secondary electrons in a number five times or greater than the number of cations which it receives, it is possible to generate plasma with a greater energy state at low power consumption.

Embodiments of the plasma generating electrode and the plasma reactor of the present invention (first and second inventions) are described below in detail with reference to the drawings. However, the invention should not be construed as being limited to the following embodiments. Various alterations, modifications, and improvements may be made within the scope of the invention based on knowledge of a person skilled in the art.

Figure 1:
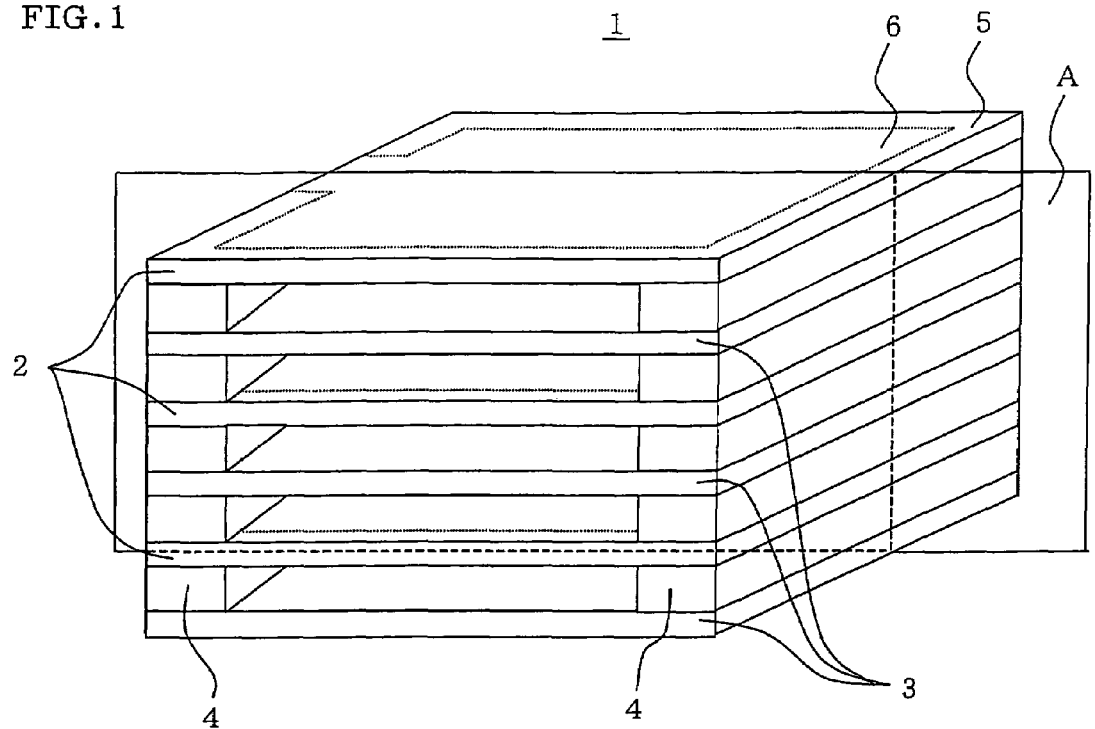
FIG. 1 is a perspective view schematically showing one embodiment of the plasma generating electrode of the invention (first invention).
Figure 2:
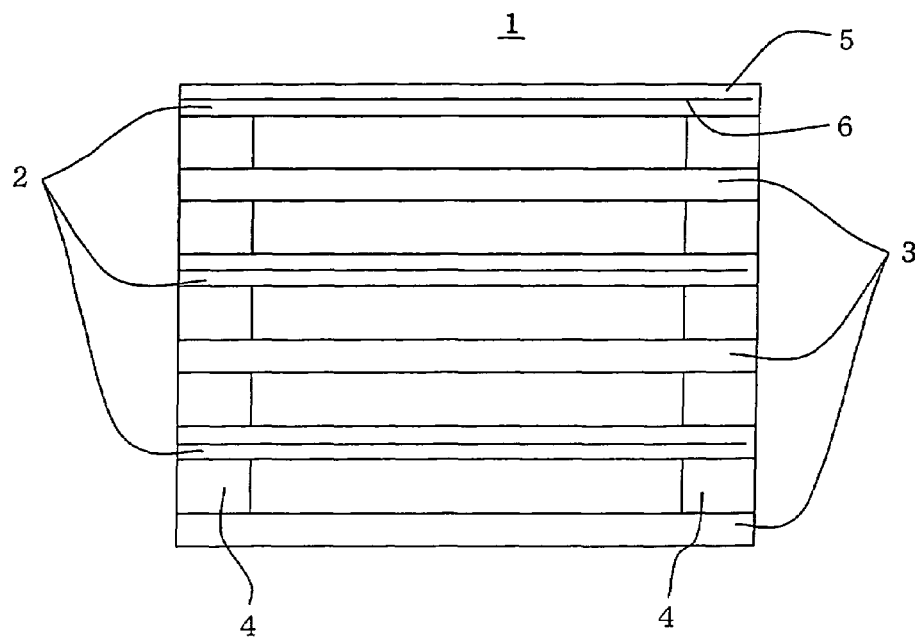
FIG. 2 is a cross-sectional view of the plasma generating electrode shown in FIG. 1, cut along the plane A.
Figure 3:
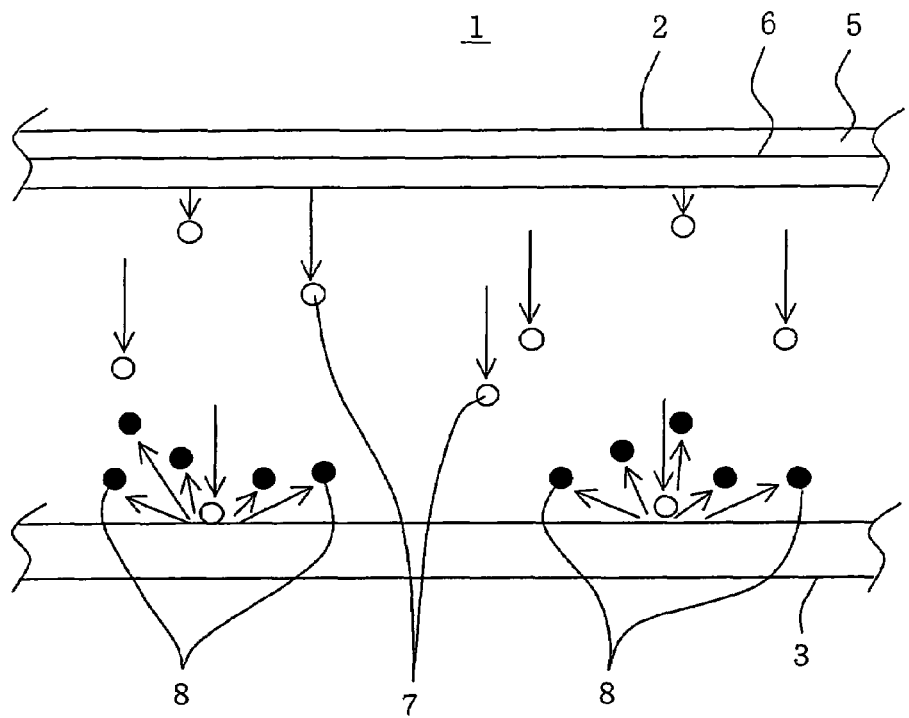
FIG. 3 is a diagram for illustrating movement of particles (cations and secondary electrons) between an anode unit electrode and a cathode unit electrode in one embodiment of the plasma generating electrode of the first invention.

As shown in FIG. 1 and FIG. 2, the plasma generating electrode 1 of this embodiment includes at least a pair of unit electrodes including a unit electrode 2 as an anode and a unit electrode 3 as a cathode and can generate plasma by applying voltage, the unit electrode 2 as an anode and the unit electrode 3 as a cathode being disposed facing each other, and at least the unit electrode 2 as an anode having a plate-like ceramic dielectric 5 and a conductive film 6 disposed in the ceramic dielectric 5, wherein the unit electrode 3 as a cathode can emit secondary electrons in a number five times or greater than the number of cations 7 (primary particles) which the unit electrode 3 receives when the cations 7 produced in the process of plasma generation collide therewith, as shown in FIG. 3.

Usually, in the process of plasma generation, cations 7 are generated in the plasma generating electrode 1 in which the unit electrode 2 as an anode (hereinafter referred to from time to time as "anode unit electrode 2") and the unit electrode 3 as a cathode (hereinafter referred to from time to time as "cathode unit electrode 3") are disposed facing each other. The cations 7 generated are drawn to the cathode unit electrode 3 by the electric field generated between the anode unit electrode 2 and the cathode unit electrode 3, and collide with the cathode unit electrode 3. The cathode unit electrode 3 receives the cations 7 by the collision of these cations 7 and the energy generated by the collision is provided to electrons in the cathode unit electrode 3, thereby causing the cathode unit electrode 3 to emit secondary electrons 8. The secondary electrons 8 acquire energy from the electric field and produce an electron avalanche, which serves as a starting point of a streamer (discharge).

In the plasma generating electrode 1 of this embodiment, when receiving cations 7, the cathode unit electrode 3 emits secondary electrons 8 in a number five times or greater than the number of cations 7 which it receives. Since the number of secondary electrons 8 emitted is greater than the number emitted by a conventional plasma generating electrode, the streamers mentioned above occur at a greater number of points and progress to a greater extent. Therefore, the plasma generating electrode of this embodiment can generate plasma with a greater energy state at low power consumption as compared with conventional plasma generating electrodes. For this reason, the plasma generating electrode can significantly improve the efficiency of the process for converting nitrogen monoxide (NO) contained in exhaust gas discharged from vehicles into nitrogen dioxide ($NO_2$).

Figure 4:
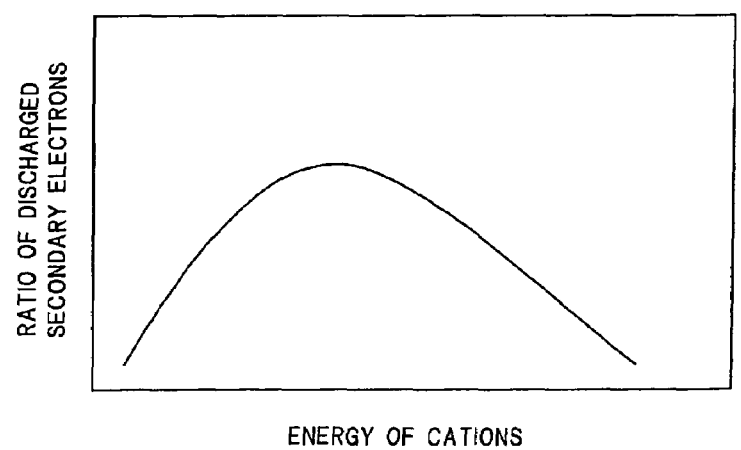
FIG. 4 is a diagram for illustrating the relationship between the energy of cations and the ratio of the number of emitted secondary electrons to the number of cations received by the cathode unit electrode (secondary emission yield).

There are no specific limitations to the material for the cathode unit electrode 3 used in the plasma generating electrode 1 of this embodiment, inasmuch as the material can emit secondary electrons 8 in a number five times or greater than the number of cations 7 which it receives. For example, the cathode unit electrode 3 preferably contains at least one material selected from the group consisting of beryllium-copper alloy, silver-magnesium alloy, aluminum-magnesium alloy, nickel-beryllium alloy, cesium oxide, binary oxide of barium and strontium, zinc sulfide, and calcium tungstate. All of these materials can emit secondary electrons 8 in a number five times or greater than the number of cations 7 which it receives and can thus be suitably used as the material for the cathode unit electrode 3 used in the plasma generating electrode 1 of this embodiment. For example, the ratio of the number of emitted secondary electrons 8 to the number of received cations 7 (hereinafter referred to from time to time as "secondary emission yield") is 7 in beryllium-copper alloy, 10 in silver-magnesium alloy, 10 to 15 in aluminum-magnesium alloy, 12 in nickel-beryllium alloy, 8 to 11 in cesium oxide, 8 in binary oxide of barium and strontium, 7 in zinc sulfide, and 7 in calcium tungstate. Although the secondary emission yeild varies according to the energy possessed by the cations as shown in FIG. 4, the maximum value is governed by the type of material receiving the cations. In this embodiment, the secondary emission yield refers to this maximum value. FIG. 4 is a diagram for illustrating the relationship between the energy of cations and secondary emission yield. A cathode unit electrode 3 that can emit a greater number of secondary electrons 8 is more preferable, insofar as the number of emitted secondary electrons 8 is five times or more of the number of cations 7 received by the unit electrode 3, as shown in FIG. 3. In general, when the above preferable materials are used, the cathode unit electrode 3 can emit secondary electrons 8 in a number 5 to 15 times greater than the number of cations 7 it receives.

The cathode unit electrode 3 used in the plasma generating electrode 1 of this embodiment shown in FIG. 1 contains preferably at least one material selected from the group consisting of beryllium-copper alloy, silver-magnesium alloy, aluminum-magnesium alloy, nickel-beryllium alloy, cesium oxide, binary oxide of barium and strontium, zinc sulfide, and calcium tungstate in an amount preferably of 50 wt % or more, and particularly preferably 90 wt % or more of the total weight of the cathode unit electrode 3. The content of these materials in the above range ensures plasma generation with a greater energy state at low power consumption.

The number of cations received by the cathode unit electrode 3 and the number of secondary electrons 8 emitted by the cathode unit electrode 3 can be determined by a method of causing cations to collide with the target material and counting the electrons generated by the collision, for example. Specifically, ions acting as primary particles are generated by surface ionization, or the like, and the generated ions are screened using a double-focusing mass spectrometer to obtain ions having a certain energy, charge, and mass. The obtained ions having the equivalent energy, equivalent charge, and equivalent mass are accelerated to the maximum of 30 keV using an acceleration lens to cause them to collide with the target material. The target material emits secondary electrons by collision with the ions. The emitted secondary electrons are accelerated to an energy level of as high as 30 keV using a cylindrical lens, converged, and caused to collide with a semiconductor detector. The secondary electrons can be obtained as electric signals by collision with a semiconductor detector and the number of secondary electrons generated by the collision can be estimated by pulse height analysis of the electric signals.

Although there are no specific limitations to the form of the anode unit electrode 2 and cathode unit electrode 3, they are preferably in the form of opposing plates so that plasma can be generated between the pair.

The anode unit electrode 2 used in the plasma generating electrode 1 of this embodiment is a barrier discharge-type unit electrode having a plate-like ceramic dielectric 5 and a conductive film 6 disposed inside the ceramic dielectric 5. The configuration enables the plasma generating electrode 1 of this embodiment to generate uniform and stable plasma between the anode unit electrode 2 and cathode unit electrode 3 by barrier discharge. Because the conductive film 6 is disposed inside the ceramic dielectric 5 in this anode unit electrode 2, the conductive film 6 does not directly come into contact with exhaust gas when using the plasma generating electrode 1 for an exhaust gas treatment device, whereby corrosion or deterioration of the conductive film 6 can be effectively prevented.

As shown in FIG. 1 and FIG. 2, the plasma generating reactor 1 of this embodiment is provided with a supporting member 4 to hold the opposing anode unit electrode 2 and cathode unit electrode 3 to be separated at a prescribed distance to form a space for generating plasma between them. Although FIG. 1 and FIG. 2 show a plasma generating electrode 1 having three anode unit electrodes 2 and three cathode unit electrodes 3, which are alternately supported by supporting members 4, the number of the anode unit electrode 2 and cathode unit electrode 3 is not limited to three.

The ceramic dielectric 5 forming the anode unit electrode 2 used in the plasma generating electrode 1 of this embodiment is preferably made of a material containing at least one ceramic selected from the group consisting of alumina, mullite, ceramic glass, zirconia, cordierite, silicon nitride, aluminum nitride, and glass. The addition of the above-described ceramics to the ceramic dielectric 5 increases heat resistance and impact resistance of the ceramic dielectric 5 and produces a plasma generating electrode 1 suitable for treating combustion exhaust gas and vehicle exhaust gas.

A tape-shaped ceramic formed body (green tape) is suitably used as the ceramic dielectric 5. The use of a green tape can reduce the thickness of the ceramic dielectric 5, downsize the plasma generating electrode 1, and reduce the resistance of exhaust gas and the like passing through the plasma generating electrode 1. A ceramic formed body molded into a prescribed shape by extrusion molding, for example, can also be used as the ceramic dielectric 5.

In the anode unit electrode 2 used for the plasma generating electrode 1 of this embodiment, the conductive film 6 forming the anode unit electrode 2 is preferably made of a material containing at least one metal selected from the group consisting of tungsten, molybdenum, manganese, chromium, titanium, zirconium, nickel, iron, silver, copper, platinum, and palladium in an amount of 60 wt % or more of the total weight of the conductive film 6.

A coating film made from a conductive material paste containing a powder of any one of metals mentioned above as suitable materials for the conductive film 6 is preferably used as the conductive film 6. A metal mesh or metal wire made from these metals can also be used.

In order to form a conductive film 6 from the conductive material paste, a method of using a ceramic body in the form of a tape (green tape) as the ceramic dielectric 5 and applying the conductive material paste prepared by, for example, mixing a powder of a metal mentioned above as the preferable material for the conductive film 6, an organic binder, and a solvent such as terpineol, to the tape-like ceramic body is preferably used. As preferable examples of a specific application method, screen printing, calender rolling, spraying, electrostatic painting, dip coating, knife coating, chemical vapor deposition, physical vapor deposition, and the like can be given. The conductive film 6 having a smooth, flat surface and a small thickness can be easily formed by using this method. An additive may be optionally added to the conductive paste in order to improve the adhesion to the ceramic green tape and to improve sintering properties.

Although there are no specific limitations, the thickness of the conductive film 6 is preferably 10 to 100 μm, and more preferably 10 to 30 μm from the viewpoint of downsizing of the plasma generating electrode 1 and reducing exhaust gas flow resistance when exhaust gases and the like are processed.

Figure 5A:
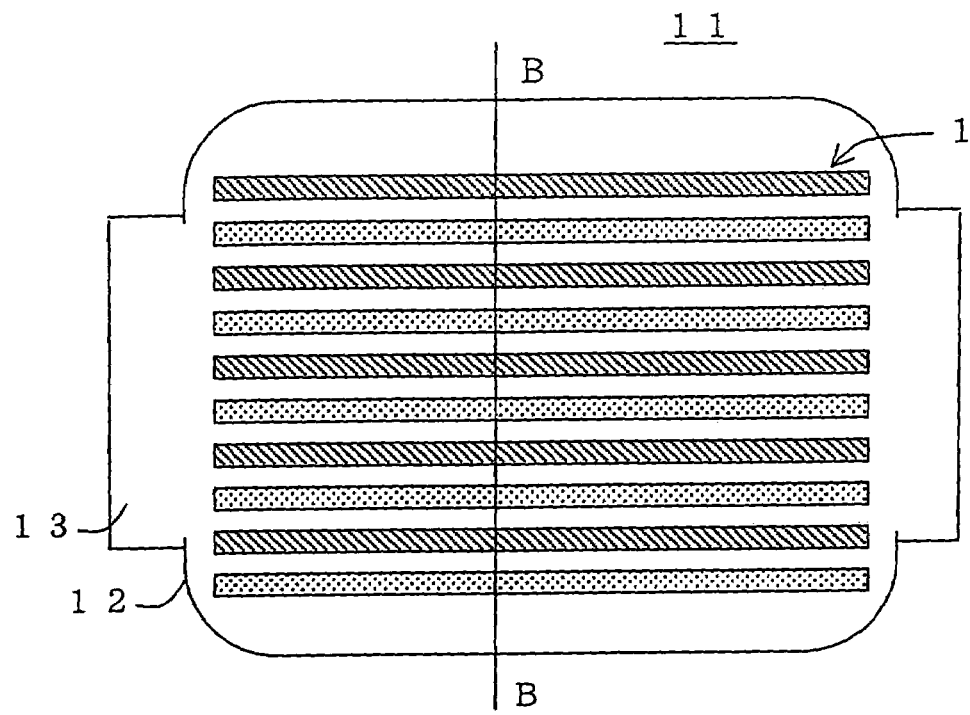
FIG. 5($a$) is a cross-sectional view showing one embodiment of the plasma reactor of the present invention (second invention) cut in the gas flow direction along a plane vertical to the surface of the electrodes disposed facing each other.
Figure 5B:
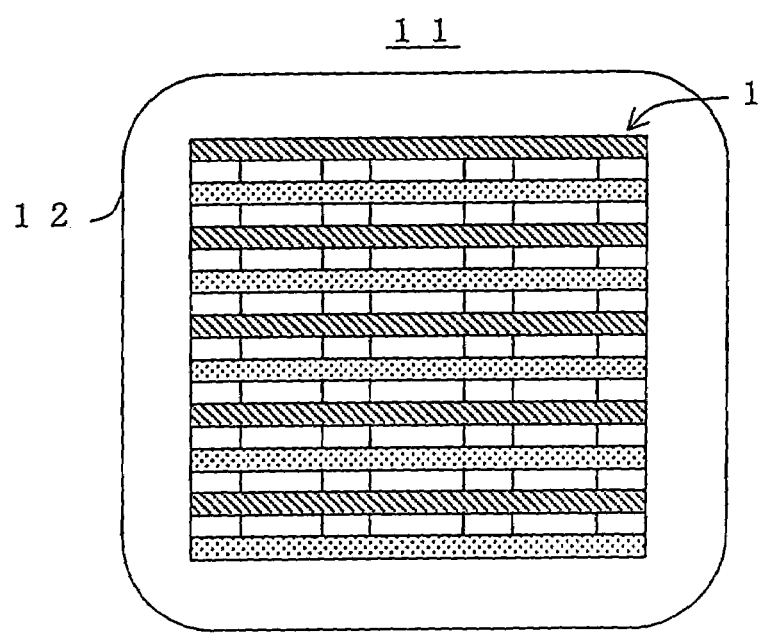

One embodiment of the plasma reactor according to the present invention (second invention) will now be described below in detail. FIG. 5(*a*) is a cross-sectional view showing one embodiment of the plasma reactor according to the invention cut in the gas flow direction along a plane vertical to the surfaces of the electrodes disposed facing each other, and FIG. 5(*b*) is a cross-sectional view along the line B-B shown in FIG. 5(*a*).

As shown in FIG. 5(*a*) and FIG. 5(*b*), a plasma reactor 11 of this embodiment includes one embodiment of the plasma generating electrode (plasma generating electrode 1) of the first invention shown in FIG. 1, and a casing 12 having a passage (gas passage 13) for a gas containing a specific component formed therein, in which, when the gas is introduced into the gas passage 13 of the casing 12, the specific component contained in the gas can be reacted by plasma generated by the plasma generating electrode 1. The plasma reactor 11 of this embodiment can be suitably used as an exhaust gas treatment device or an ozonizer which produces ozone by reacting oxygen in air, for example. The plasma generating electrode 1 of the first invention can generate plasma with a greater energy state at low power consumption because the cathode unit electrode can emit secondary electrons in a number five times or greater than the number of cations it receives.

The material for the casing 12 forming the plasma reactor 11 of this embodiment is not particularly limited. For example, ferritic stainless steel and the like are preferable due to excellent conductivity, lightweight and low cost, and properties showing only a small amount of deformation by thermal expansion.

The plasma reactor of this embodiment may include a power supply (not shown) for applying voltage to the plasma generating electrode. As the power supply, any conventionally known power supply can be used insofar as it can supply current which can cause plasma to be effectively generated. It is preferable that the power supply be a pulsed power supply. It is still more preferable that the power supply include at least one SI thyristor. Plasma can be more efficiently generated by using such a power supply.

Instead of having a power supply in itself, the plasma reactor of this embodiment may include an electricity supply part such as a plug outlet which supplies current from an external power supply source.

Current supplied to the plasma generating electrode forming the plasma reactor may be appropriately selected according to the intensity of plasma to be generated. When installing the plasma reactor in an automotive exhaust system, it is preferable that current supplied to the plasma generating electrode be a direct current at a voltage of 1 kV or more, a pulsed current having a peak voltage of 1 kV or more and a pulse number per second of 100 or more (100 Hz or more), an alternating current having a peak voltage of 1 kV or more and a frequency of 100 or more (100 Hz or more), or a current generated by superimposing these two types of current. Plasma can be efficiently generated in this manner.

EXAMPLES

The invention is described below in detail by way of examples.

However, the invention should not be construed as being limited to the following examples.

Example 1

The plasma generating electrode (Example 1) including five sheets of unit electrodes as anodes (anode unit electrodes) and four sheets of unit electrodes as cathodes (cathode unit electrodes) receiving cations generated in the plasma generating process, each sheet being disposed facing each other with a space of 1 mm between them, was prepared.

The anode unit electrode has a plate-like ceramic dielectric and a conductive film disposed in the ceramic dielectric. The ceramic dielectric is formed using an alumina green sheet. The ceramic dielectric has a surface with a shape of a 90 mm×50 mm rectangle and a thickness of 1 mm. The conductive film is formed by printing a paste containing tungsten approximately at the center of the ceramic dielectric.

The conductive film has a length of 80 mm, a width of 48 mm, and a thickness of 10 μm. The cathode unit electrode is made from beryllium copper with a purity of almost 100 wt % into a surface configuration of a 90 mm×50 mm rectangle and a thickness of 1 mm. The beryllium copper used as the material for the cathode unit electrode has a secondary emission yield 7.

An experiment of converting NO into $NO_2$ in a simulated model exhaust gas was carried out using the plasma generating electrode of Example 1. A $N_2$-based model gas containing 14% of $O_2$, 4.5% of $CO_2$, 1,000 ppm of CO, 600 ppm of THC (total hydrocarbon), 200 ppm of NO, and 4% of $H_2O$ was fed at a space velocity of 200,000. A high repetition pulse was applied to the anode unit electrode at frequency of 1 kHz. The experiment resulted in a 85% conversion rate of NO into $NO_2$ at a power consumption of 30 W.

Comparative Example 1

A plasma generating electrode (Comparative Example 1) with the same configuration as the plasma generating electrode of Example 1 was prepared in the same manner as in Example 1, except for using stainless steel with a secondary emission yeild of 1.3 for the cathode unit electrode. The experiment of converting NO into $NO_2$ in a simulated exhaust gas was carried out in the same manner as in Example 1. The experiment resulted in a 85% conversion rate of NO into $NO_2$ at a power consumption of 60 W. About two times as much electric power as that consumed by the plasma generating electrode of Example 1 was required for obtaining the same conversion rate as in Example 1.

The plasma generating electrode of the present invention can generate plasma with a greater energy state at low power consumption, because the cathode unit electrode can emit secondary electrons in a number five times or greater than the number of cations it receives. For this reason, the plasma generating electrode can significantly improve the efficiency of the process for converting nitrogen monoxide (NO) contained in exhaust gas discharged from vehicles into nitrogen dioxide ($NO_2$). Since the plasma reactor of the present invention includes such a plasma generating electrode, the plasma reactor can generate uniform and stable plasma. Therefore, the plasma reactor can be used for exhaust gas treating devices of automobiles, and the like.

What is claimed is:

1. A plasma reactor comprising:
   a plasma generating electrode that generates plasma by applying voltage; and
   a casing having a passage (gas passage) for a gas containing a specific component formed therein,
   wherein, when the gas is introduced into the gas passage of the casing, the specific component contained in the gas reacts with the plasma generated by the plasma generating electrode,
   wherein the plasma generating electrode comprises at least a pair of unit electrodes including a unit electrode as an anode and a unit electrode as a cathode,
   the unit electrode as an anode and the unit electrode as a cathode being disposed facing each other, and at least the unit electrode as an anode having a plate-like ceramic dielectric and a conductive film disposed in the ceramic dielectric,
   wherein the unit electrode as a cathode emits secondary electrons in a number five times or greater than the number of cations (primary particles) which it receives when the cations produced in a process of plasma generation collide therewith,
   wherein the unit electrode as a cathode contains at least one material selected from the group consisting of a beryllium-copper alloy, silver-magnesium alloy, aluminum-magnesium alloy, nickel-beryllium alloy, cesium oxide, binary oxide of barium and strontium, zinc sulfide, and calcium tungstate.

2. The plasma reactor according to claim 1, wherein the ceramic dielectric of the unit electrode as an anode contains at least one ceramic selected from the group consisting of alumina, mullite, ceramic glass, zirconia, cordierite, silicon nitride, aluminum nitride, and glass.

3. The plasma reactor according to claim 1, wherein the conductive film of the unit electrode as an anode contains at least one metal selected from the group consisting of tungsten, molybdenum, manganese, chromium, titanium, zirconium, nickel, iron, silver, copper, platinum, and palladium.

4. The plasma reactor according to claim 1, further comprising one or more pulse power supplies for applying voltage to the plasma generating electrode.

5. The plasma reactor according to claim 4, wherein the pulsed power supply includes with at least one SI thyristor.

6. The plasma reactor according to claim 1, wherein the conductive film is embedded within the ceramic dielectric.

* * * * *